United States Patent
Fan et al.

(10) Patent No.: US 7,227,364 B1
(45) Date of Patent: Jun. 5, 2007

(54) TEST CIRCUIT FOR AND METHOD OF IDENTIFYING A DEFECT IN AN INTEGRATED CIRCUIT

(75) Inventors: Yuezhen Fan, San Jose, CA (US); David Mark, San Jose, CA (US); Eric J Thorne, Santa Cruz, CA (US); Zhi-Min Ling, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/016,473

(22) Filed: Dec. 16, 2004

(51) Int. Cl.
*G01R 31/28* (2006.01)
*G01R 31/26* (2006.01)

(52) U.S. Cl. .................................... 324/528
(58) Field of Classification Search ............... None
See application file for complete search history.

(56) References Cited

U.S. PATENT DOCUMENTS 7,068,039 B2 * 6/2006 Parker ........................ 324/519
7,075,307 B1 * 7/2006 Williamson ................. 324/519

OTHER PUBLICATIONS

U.S. Appl. No. 10/703,326, filed Nov. 7, 2003, Fan et al.

* cited by examiner

*Primary Examiner*—Ha Tran Nguyen
*Assistant Examiner*—Trung Q. Nguyen
(74) *Attorney, Agent, or Firm*—John J. King

(57) ABSTRACT

The embodiments of the present invention enable a new metal diagnosis pattern based on a production test pattern to quickly identify open and short circuits of metal lines which cannot be probed, such as the long lines of a programmable logic device, and to further isolates the fault location for physical failure analysis. According to one aspect of the invention, a circuit locally drives a plurality of metal long line segments to determine whether a defect in a line is a short circuit, or further to identify the location of an open circuit.

20 Claims, 6 Drawing Sheets

TEST CIRCUIT FOR AND METHOD OF IDENTIFYING A DEFECT IN AN INTEGRATED CIRCUIT

FIELD OF THE INVENTION

The present invention relates generally to integrated circuits, and in particular, to a test circuit for and a method of identifying a defect in an integrated circuit.

BACKGROUND OF THE INVENTION

In manufacturing semiconductor devices, it is important that the devices are free of defects at the time of production, and reliable throughout their use. When defects are found in a die on a wafer, the percentage of usable die decreases, and the profitability of the manufacturer is impacted. More importantly, when a completed semiconductor device fails after it has been installed in a finished product, such as a consumer electronics product, the failure of the semiconductor device can cause the entire product to fail. That is, the failure of a single semiconductor device can render an entire consumer electronics device unusable. Accordingly, it is important that manufacturers of semiconductor devices identify and eliminate defects whenever possible.

Most semiconductor devices are built up using a number of material layers. Each layer is patterned to add or remove selected portions to form circuit features that will eventually make up a complete integrated circuit. The patterning process, such as photolithography, defines the dimensions of the circuit features. Modern semiconductor devices have a significant number of layers formed using complex sequences of process steps. Because problems encountered in the formation of any one layer can render an entire device defective, defective devices are therefore tested to physically locate defects. One goal of testing devices is to identify defective layers, which helps to troubleshoot device processes. After identifying a defective layer, it is also useful to identify the defect, such as by type, location (i.e. by conductor or more specifically within a conductor), etc.

Some semiconductor devices, such as field programmable gate arrays (FPGAs) or complex programmable logic device (CPLDs) (collectively known as programmable logic devices (PLDs)), include extensive routing resources. The routing resources are typically collections of parallel metal lines, also commonly called "conductors," "interconnect lines," or "interconnects," formed using overlapping and isolated metal layers. Insulating layers separate the metal layers, enabling the metal lines to comprise interconnect lines between different layers by making contact through "vias" that extend through the insulating layers. The metal lines in a given layer are minimally spaced to reduce their impact on device area, and are consequently susceptible to short circuits, also called "bridge" defects, that join adjacent wire conductors. These conductors are also exceptionally small in cross section, and are consequently susceptible to open circuits (i.e. points along a given connector that are undesirably electrically disconnected).

Conventional FPGA interconnect designs typically allow some metal lines in certain layers to be probed by components of the circuit (e.g. coupled to a circuit within the integrated circuit to enable a voltage at a node to be captured and read). This ability to probe various points of a conductor of a metal layer makes fault isolation possible for those lines. A group of failure analysis (FA) test patterns called Metal-FA-Pattern is used to test each specific single metal interconnect layer. The Metal-FA-Patterns are used to monitor the quality of the process to form the physical metal layer by using post processed pass/fail results from wafers, and provide quick feed back to process engineers for yield enhancement.

However, some metal lines residing in certain metal layers may not be available to be probed. In many cases, metal layers include conductors having similar lengths, and are formed on separate horizontal and vertical layers. The length of a conductor could be defined by the number of conductor segments coupled between a pair of programmable interconnect points (PIPs). Relatively short conductors (e.g. "double lines" comprising two segments between PIPs could be included in a first pair of metal layers. Similarly, "hex lines" comprising six segments coupled between PIPs could be formed on another pair of horizontal and vertical metal layers, while relatively long conductors extending between the edges of the integrated circuit could be formed on another pair of horizontal and vertical metal layers. While it may be possible to probe nodes of the conductors of certain metal layers, it may not be possible to probe conductors of other layers, depending upon the design of the integrated circuit. However, it is also important to identify failures in the metal layers which cannot be probed.

Accordingly, there is a need for an improved test circuit for and method of identifying the type and location of a defect in a metal layer of an integrated circuit having conductors which cannot be probed.

SUMMARY OF THE INVENTION

The embodiments of the present invention enable a new metal diagnosis pattern based on a production test pattern to quickly identify open circuits of metal conductors which cannot be probed, and to further isolate the fault location for physical failure analysis. According to one aspect of the invention, a circuit locally drives a plurality of metal conductor segments to determine the location of an open circuit. The circuit could also be used to determine whether a defect is caused by a short circuit.

According to one embodiment of the invention, a circuit for determining the location of a defect in an integrated circuit is disclosed. The circuit comprises a conductor extending from a first node to a second node. A driver circuit is coupled to the conductor at a plurality of nodes between the first node and the second node, one node at a time. Finally, a detector circuit is coupled to the second node of the conductor. The location of the open circuit is determined based upon the detected signals. According to other embodiments of the invention, a plurality of conductors is coupled, for example by registers, to more quickly identify a defect in a large number of conductors.

A method of determining the location of a defect in an integrated circuit is also disclosed. The method comprises steps of coupling an input signal to a first end of a conductor of the integrated circuit, and detecting an output signal at a second end of the conductor in order to determine whether the conductor is defective. A signal is then coupled to a plurality of nodes of the defective conductor to determine the location of a defect of the defective conductor. Methods of detecting defects in a large number of conductors are also disclosed.

DETAILED DESCRIPTION OF THE DRAWINGS

The various embodiments of the present invention enable the detection of a defect in a conductor of an integrated circuit. While the circuits and methods find particular application in a programmable logic device, the circuits and methods could be employed in any integrated circuit enabling design for testability (DFT). One example of an integrated circuit which finds particular use for the circuits and methods of the present invention is a programmable logic device, such as an FPGA. Specific implementations of the circuits of the present invention are described with respect to an FPGA. While programmable logic devices comprise circuits which provide advantages in implementing the circuits and methods of the invention, it should be understood that the circuits and methods could be employed in other types of integrated circuit.

Figure 1:
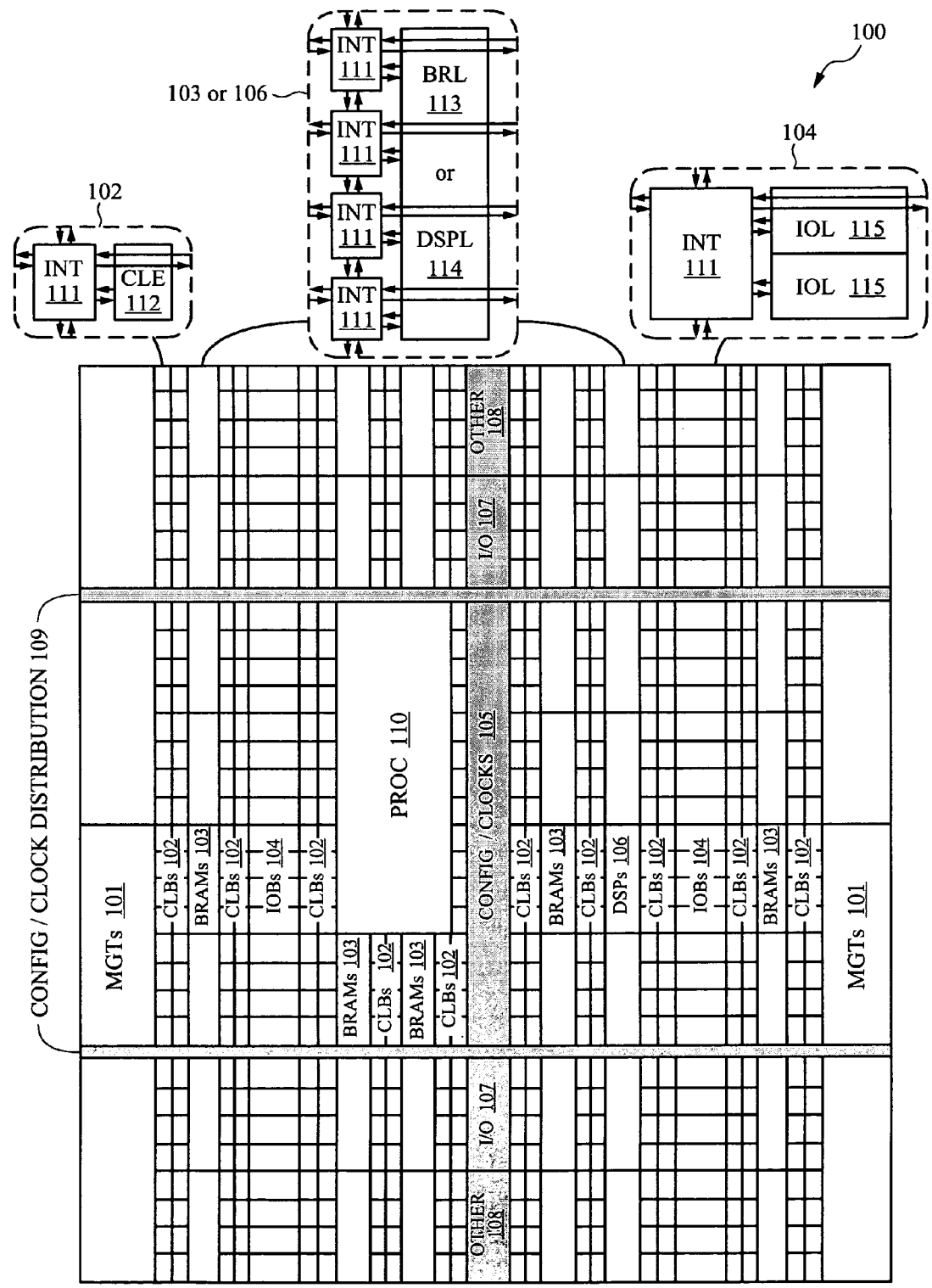
FIG. 1 is a plan view of an integrated circuit showing the arrangement of circuit elements according to an embodiment of the present invention.

A block diagram of a circuit for implementing embodiments of the present invention is shown in FIG. 1. In particular, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

The layers of the circuit of FIG. 1 could be grouped. For example, the first group of layers could be the various functional blocks comprising a programmable logic portion, such as BRAM or CLBs of a programmable logic device, while the interconnect circuits could be positioned in a second group of layers. The interconnect layers could be formed to generally have a common length of conductor, where even layers of the interconnect layers could be used to route signals in a vertical direction, while odd layers could be used to route signals in a horizontal direction.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 2:
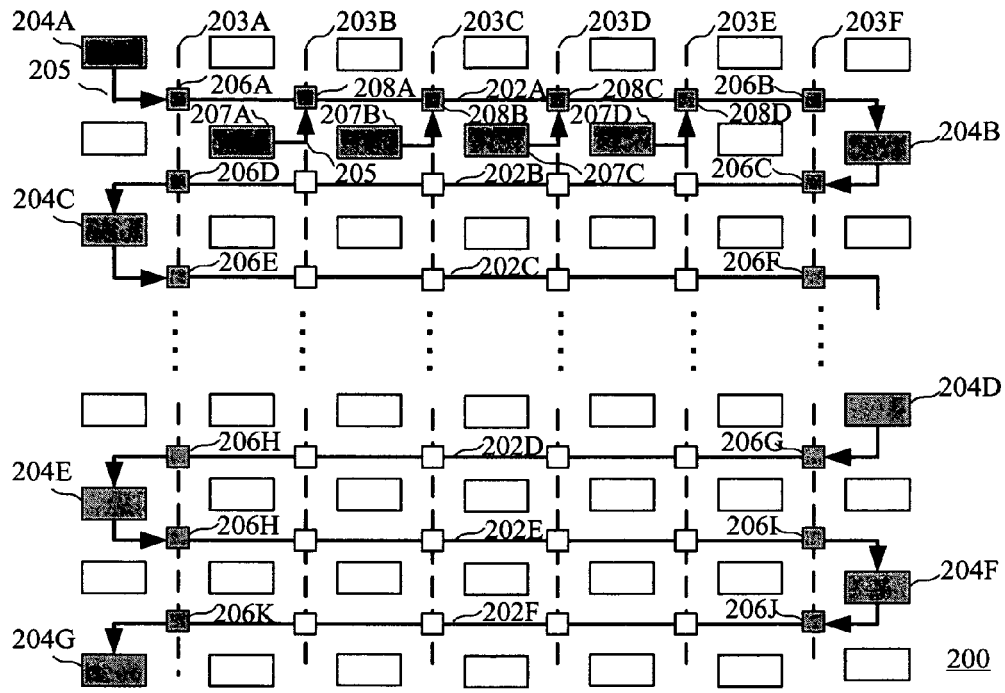
FIG. 2 is a block diagram of a circuit for determining the location of a defect in a conductor of an integrated circuit according to an embodiment of the present invention.

Turning now to FIG. 2, a block diagram of a circuit for determining the location of a defect in a conductor of an integrated circuit is shown. In particular, FIG. 2 shows a programmable logic device (PLD) 200 having a layer comprising conductors 202A–202F extending horizontally. The conductors 202A–202F are long conductors because they extend substantially from a first end of the circuit to a second end of the circuit. Long conductors programmably connect components which are on other layers and are spaced farther apart. Long conductors 203A–F (shown in dashed lines extending in a vertical direction) are formed on another layer. Although long conductors are shown by way of example, the circuits and methods of the present invention could be used with other type of conductor.

PLD 200 further comprises an array of configurable logic blocks (CLBs) 204 and programmable interconnect resources. The programmable interconnect resources include conductors and programmable interconnect points (PIPs) 206. Each CLB 204 also preferably includes configuration memory cells. The contents of the configuration memory cells determine the configuration of CLBs 204 and the programmable interconnect resources. Short conductors 205 connect neighboring components in PLD 200. Specific programmable logic blocks and programmable interconnect points which are used to describe an implementation of the present invention are shaded. The PLD 200 could be selected from the programmable logic devices commercially available from Xilinx, Inc., of San Jose, Calif., for example.

To identify interconnect defects in PLD 200, test circuits are instantiated into PLD 200. In the example of FIG. 2, the test circuit includes CLBs 204A–G on opposite ends of the circuit connected in series using long conductors 202A–F, and CLBs 207A–D which drive PIPs 208A–D. During operation, CLBs 204A–204F transmit test signals to an associated downstream CLB via conductors 202A–F. Data received in CLBs 204B–G are then compared with the expected data to determine if a defect exists.

After a defect is detected in one or more of the conductors, a signal is coupled to a defective conductor at various points to identify the defect. As will be described in more detail below, the circuit of the present invention will enable determining the location of an open circuit. As shown in FIG. 2, configurable logic blocks 207A–D couple a signal to the conductor 202A by way of PIPs 208A–D, respectively, to determine the location of the open circuit. Although the CLBs 207 could be sequentially coupled to conductor 202 by way of the PIPs 208 to drive the nodes, as will be described in more detail in reference to FIGS. 4 and 5, a driver circuit could be coupled to the plurality of nodes, where the driver circuit is coupled to the plurality of nodes and sequentially couples a signal to a node of the plurality of nodes. For example, a multiplexer coupling outputs to a plurality of nodes could be used to couple a signal to a node of the plurality of nodes. That is, one or more of the CLBs 207 could provide a switching network for routing a signal to a given node. Accordingly, the circuit of FIG. 2 enables determining the location of an open circuit in conductor 202A by driving the conductor by way of the PIPs 208A–D. Such an implementation is particularly useful where some or all of the PIPs 208A–D cannot be used to probe a voltage on the conductor.

Although the example of FIG. 2 shows detecting the identity of a defect in conductor 202A, the configurable logic blocks of the circuit could be used to identify a defect in any of the conductors, whether they are short conductors or long conductors, including defects in multiple conductors. It should be understood that while the implementation of the circuit of FIG. 2 relates to a single layer, the circuit could be implemented on each layer. Further, although the methods of the present invention provide a particular advantage where a node cannot be probed, the circuits and methods of the present invention could be employed for layers having nodes that could be probed. The circuit of FIG. 2 could also be used to probe a defect in a layer using interconnect points which allow probing of a node, as described for example in U.S. patent application Ser. No. 10/703,326, entitled "METHODS AND CIRCUITS FOR LOCALIZING DEFECTIVE INTERCONNECT RECOURCES IN PROGRAMMABLE LOGIC DEVICES, filed on Nov. 7, 2003 by David Mark et al., the entire application of which is incorporated herein by reference. That is, the circuits and methods of the present invention could be used in conjunction with the circuits and methods of U.S. patent application Ser. No. 10/703,326 to identify the defective conductors on a layer, and either probe or drive defective conductors depending upon the layer having a defect. The testing of conductors can be performed on all defective conductors in the same pattern under test at the same time, because the embodiments of the present invention use no additional logic if employed in a programmable logic device (or use very limited additional logic circuits and interconnects to perform the test if employed in a DFT device), and no extra I/Os are required. Accordingly, the embodiments of the present invention are useful as a yield improvement test requiring localizing multiple defects on a single die.

Figure 3:
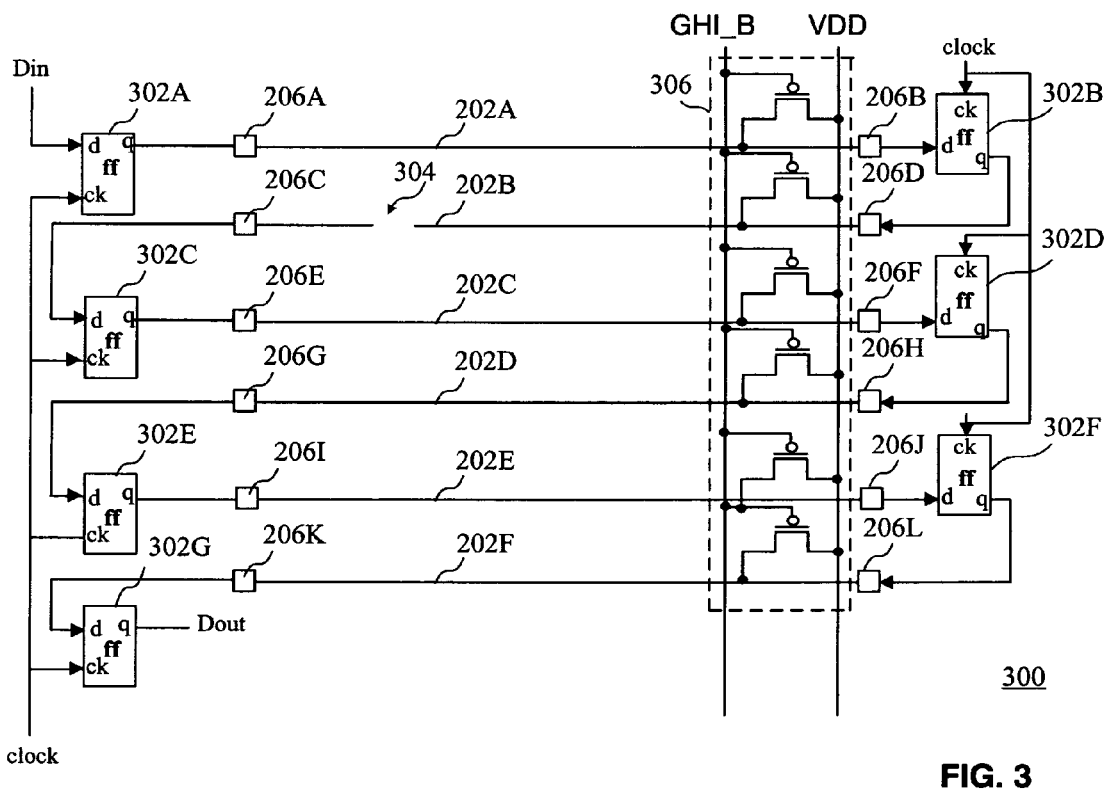
FIG. 3 is a block diagram of a circuit for detecting a defective conductor of a plurality of conductors according to an embodiment of the present invention.

Turning now to FIG. 3, a block diagram of a circuit for detecting a defective conductor of a plurality of conductors is shown. In particular, FIG. 3 shows a test circuit 300 for localizing open defects, and is functionally similar to the test circuit described above in connection with FIG. 2. Test circuit 300 includes a number of registers 302A–G. The registers could be implemented in CLBs 204 of FIG. 2, for example. The registers enable a serial connection of the conductors 202A–F using PIPs 206A–K.

To illustrate the process of identifying a defective conductor, an open circuit 304 is shown FIG. 3. A transistors block 306 connects the conductors 202A–F to a supply voltage VDD in response to a global control signal GHI_B. When asserted, the GHI_B signal pulls each conductor 202A–F to a high voltage level. The conductors are thus disabled during the configuration process to avoid data contention that might otherwise occur between the conductors.

Test circuit 300 indicates the presence of an open circuit 304 by presetting registers 302A–G to known logic levels, and then shifting data through test circuit 300 (e.g., from data terminal Din to data terminal Dout). Because an open circuit 304 disrupts the flow of data, the open circuit can therefore be detected by attempting to transfer data between registers and reading the results of the attempted transfers. Test circuit 300 enables quickly and precisely locating open circuit 304 by taking advantage of the fact that the conductors 202A–F are pulled high during device configuration. That is, test circuit 300 is initialized with registers 302A–G set to logic zeroes. Registers 302A–G are then promptly clocked once by presenting a clock edge on clock terminals Ck. Because transistor block 306 holds the conductors 202A–F high to disable the interconnect during device configuration, the conductors are at a logic level representative of a logic one unless pulled low by an associated register. In test circuit 300, for example, each conductor connected to the output of an associated register 302 is pulled to a low voltage after the first clock signal. However, because register 302C is isolated from the output of register 302B by open circuit 304, the input of register 302C remains high. Register 302C will therefore be the only register having a high voltage level after receipt of a clock edge.

As will be described in more detail in reference to FIG. 4, conventional PLDs support "readback" functionality that allows reading the contents of the registers 302A–G in order to determine the location of defects. In the example of FIG. 3, readback data would indicate that each register in test circuit 300 was low, with the exception of register 302C. Accordingly, the readback data would indicate the presence of open defect 304 somewhere in the data path extending between register 302B and register 302C.

Figure 4:
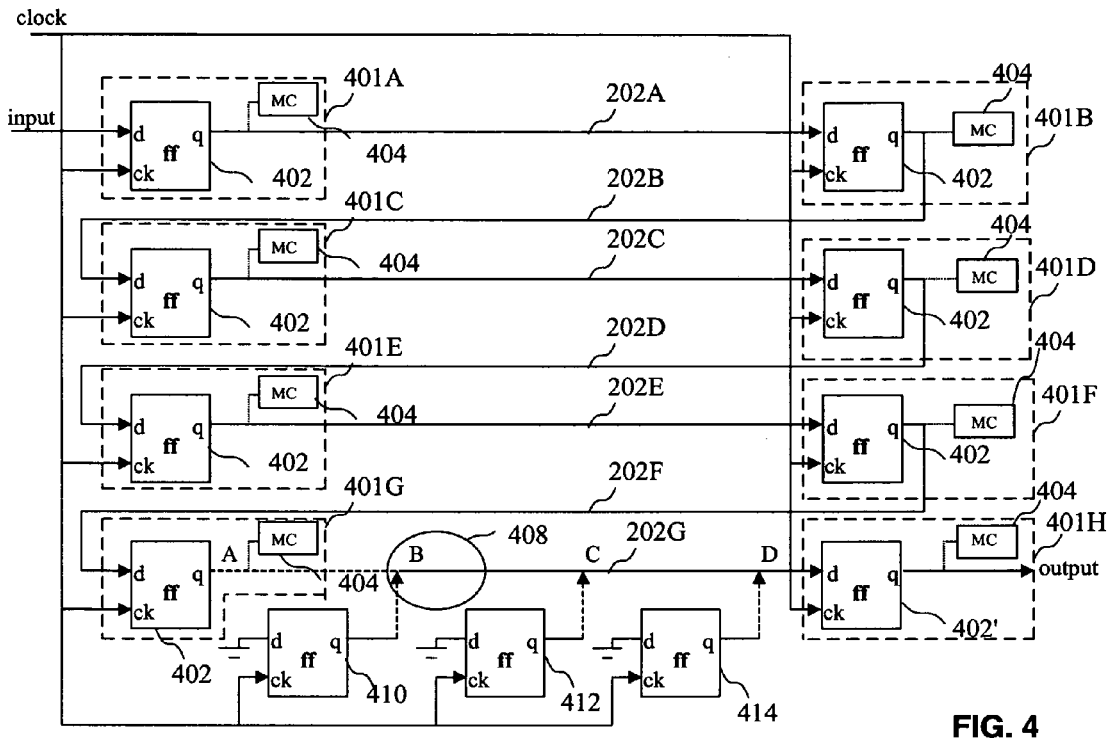
FIG. 4 is a block diagram of a circuit for determining the location of a defect in a conductor according to an embodiment of the present invention.

Turning now to FIG. 4, a block diagram of a circuit for determining the location of a defect in a conductor according to an embodiment of the present invention is shown. As shown in FIG. 4, each register block 401A–G comprises a register 402 and a memory element 404. The contents of the memory elements could be compared to expected data to determine which conductors have a defect, as described above with respect to FIG. 3. After detecting a defective conductor, additional registers are used to drive the defective conductor, preferably on a segment-by-segment basis. That is, the test patterns will configure nearby registers to drive the defective conductor, with one register driving each segment of the defective conductor. The inputs of the registers are preferably either tied to Gnd or Vcc to match the original driving logic state of the conductor. Tying the inputs to Gnd or Vcc avoids the use of I/O pads to drive the nodes via complex interconnect routing. If there is an open defect in the defective conductor, the receiving register will not receive the correct logic value from driving register.

For example, as shown in FIG. 4, if driving from A and B, the destination register 402' will not receive correct data due to the open 408 in the conductor 202G. However, when driving from C and D, the destination register 402' will receive the correct data. Therefore, the fault will be judged as an open defect, and determined to be physically located between B and C. Preferably, the defective conductor would be driven by a register sequentially from either end of the conductor to easily determine the location of the defect. For example, if starting from the input end, the registers would be used to sequentially drive the individual nodes from node B to node D. If starting from the output end of the conductor, the registers would be used to sequentially drive the defective conductor from node D to node B. Although it is possible to terminate the process of sequentially driving the nodes if a defect is detected, it is desirable to sequentially drive all of the nodes to ensure that the defect is not in a register driving the node, the conductor from the register to the node, or a PIP at the node. If the failing line is shorted to Vcc, Gnd or other lines, the destination register 402' will never receive correct data regardless of whether the conductor was driven from points A, B, C or D. The routing from register 410–414 to the defective conductor uses minimum local short interconnections to avoid activation of the defects unrelated to the metal layer of interest.

Figure 5:
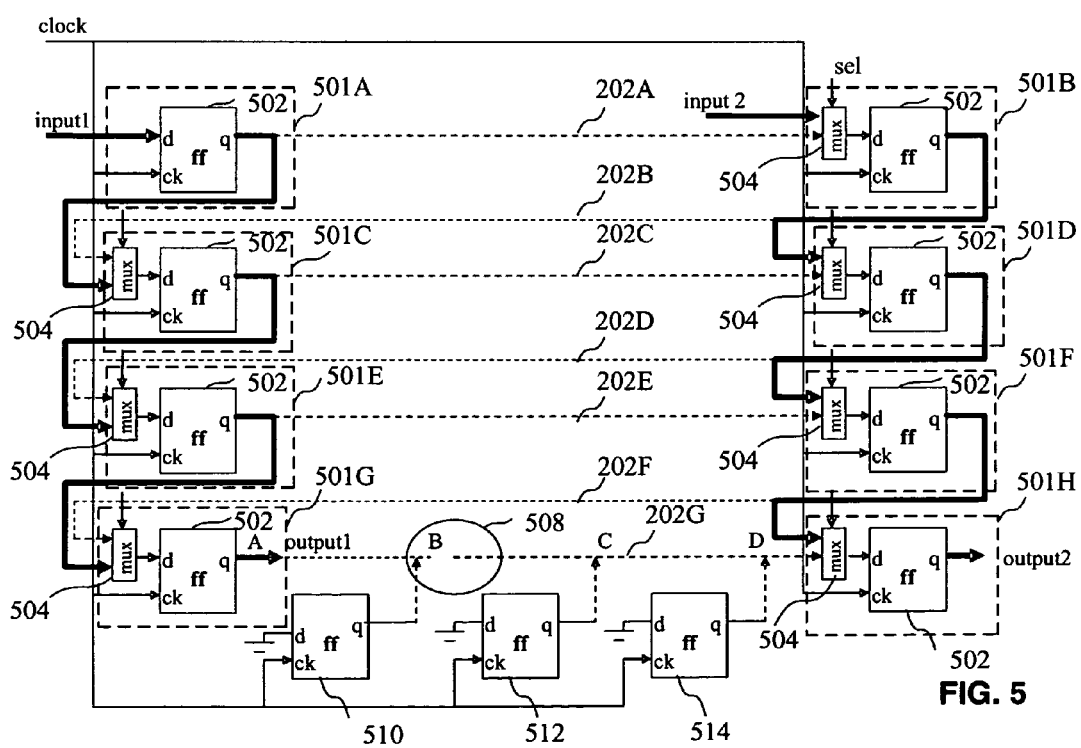
FIG. 5 is a block diagram of a circuit for determining the location of a defect in a conductor according to an alternate embodiment of the present invention.

Turning now to FIG. 5, a block diagram of a circuit for determining the location of a defect in a conductor according to an alternate embodiment of the present invention is shown. In particular, it is possible to identify defective conductors in the circuit by employing multiplexers in place of the memory elements described above with respect to FIG. 4. Routing circuits 501A–G preferably comprise a register 502 and a multiplexer 504. The routing circuits are arranged in columns on either end of the conductors 202A–202F. Each column of routing circuits has an input and an output, and is initially tested to determine whether each of the registers in the column and the connections between the registers are functioning properly. The multiplexer of each routing circuit (after routing circuits 501A and 501B) is coupled to receive an input from an upstream conductor or an upstream register in its corresponding column.

For example, multiplexer 504 of register block 501D is coupled to receive a signal from conductor 202C or routing circuit 501B. When determining if a defect exist in conductor 202C, a signal latched in routing circuit 501C would be detected at output 2 after being clocked through the registers in the column of registers on the right (i.e. registers 501D, 501F, and 501H) after a known number of clock cycles. Similarly, when determining if a defect exist in conductor 202D, a signal latched in routing circuit 501D would be detected at output 1 after being clocked through the column of registers on the left after a known number of clock cycles. Accordingly, the embodiment of FIG. 5 enables the detection of defects in the conductors without the use of memory elements. The circuit of FIG. 5 also enables the detection of multiple defective conductors.

According to one unique aspect of the circuit of FIGS. 4 and 5, multiple defective conductors could be detected in a single clock cycle. Also, the location of the defects in the multiple conductors can be determined simultaneously. That is, points B, C, and D along each defective conductor could be driven at the same time. Therefore, all of the defects could be located in the number of clock cycles required to drive a conductor. Alternatively, the existence and location of defects could be determined by simultaneously probing all of the conductors, regardless of whether a defect has been detected in all of the conductors. Although registers are shown coupled to nodes B–D of a single conductor, other registers could be simultaneously coupled to the nodes of some or all of the other conductors.

Figure 6:
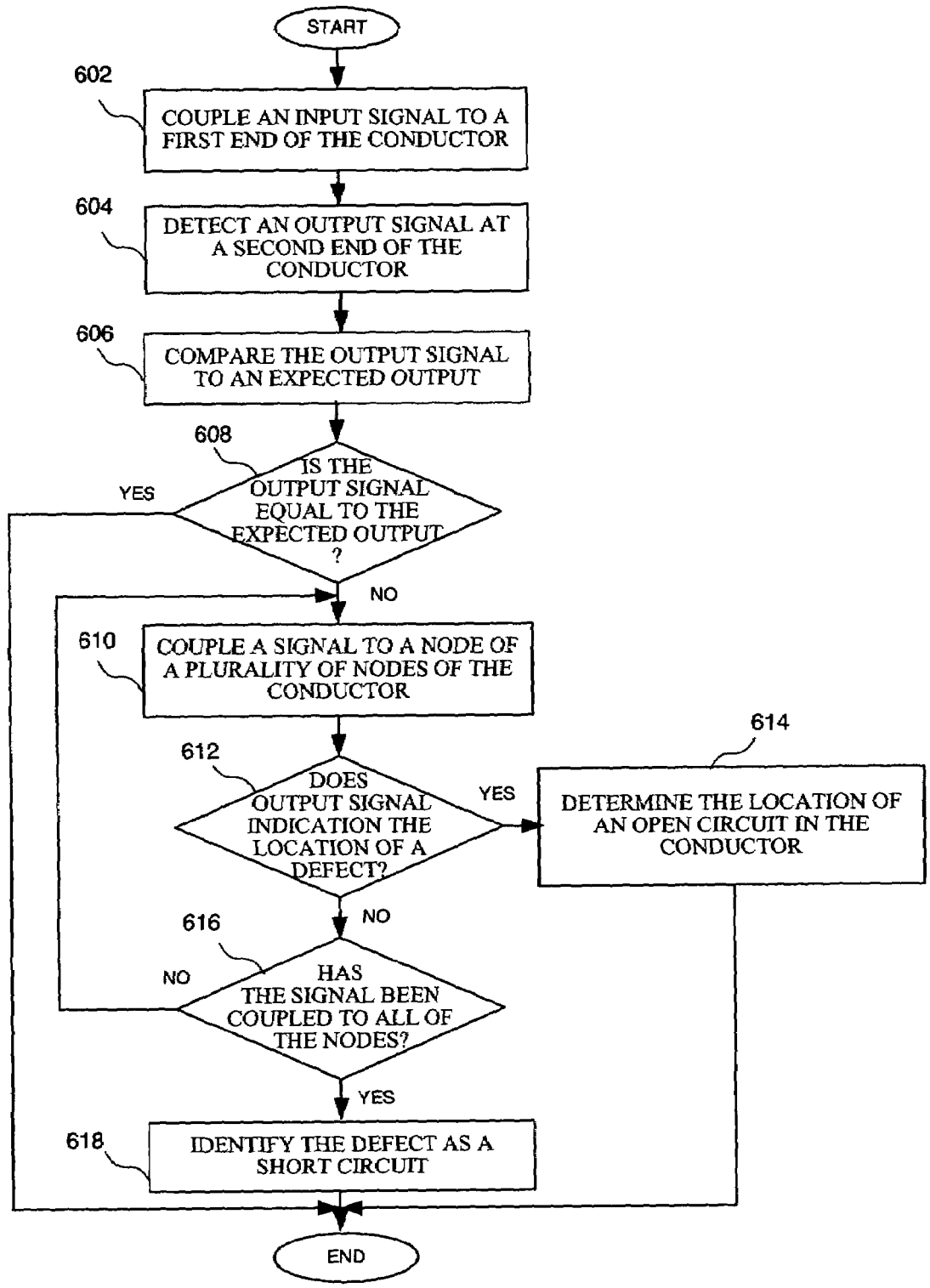
FIG. 6 is a flow chart of a method of detecting the location of a defect in a conductor according to an embodiment of the present invention.

Turning now to FIG. 6, a flow chart shows a method of detecting the location of a defect in a conductor according to an embodiment of the present invention. The method of FIG. 6, as well as the methods of FIGS. 7 and 8 described below, could be implemented using the circuits of FIGS. 1–5, or some other suitable circuit. After identifying a failing device, an input signal is coupled to a first end of a conductor at a step 602. An output signal is detected at a second end of the conductor at a step 604. The output signal is compared to an expected output at a step 606. It is then determined whether the output signal is equal to the expected output at a step 608. If so, the conductor is determined to not have a defect, and the process is ended.

If the output is not as expected, it is determined that there is a defect in the conductor, and it is necessary to determine the type of defect and the location of the defect (i.e. in the event that the defect is an open circuit). Therefore, a signal is coupled to a node of a plurality of nodes of the conductor at a step 610. It is then determined whether the output signal indicates that the location of a defect has been detected at a step 612. For example, if applying a signal to point B, then point C, followed by point D, a defect would be detected when the expected value (based upon the signal driving the node) is detected at the output. If applying a signal to point D, then point C, followed by point B, a defect would be detected when an unexpected value is detected at the output. If the output signal indicates that the location of a defect has been detected, the defect is determined to be an open circuit and the location of the defect is determined at a step 614. A defect would be detected between the node being driven and the immediately proceeding node that had been driven. If a defect has not been located, it is then determined whether the signal has been coupled to all of the nodes at a step 616. If all of the nodes have not been driven, the signal is coupled to the next node at the step 610. If the signal has been coupled to all of the nodes, the defect is identified as a short circuit at a step 618. That is, because the conductor was initially identified as being defective, but the attempts to determine the location of the defect have failed, the defect is determined to be a short circuit.

Figure 7:
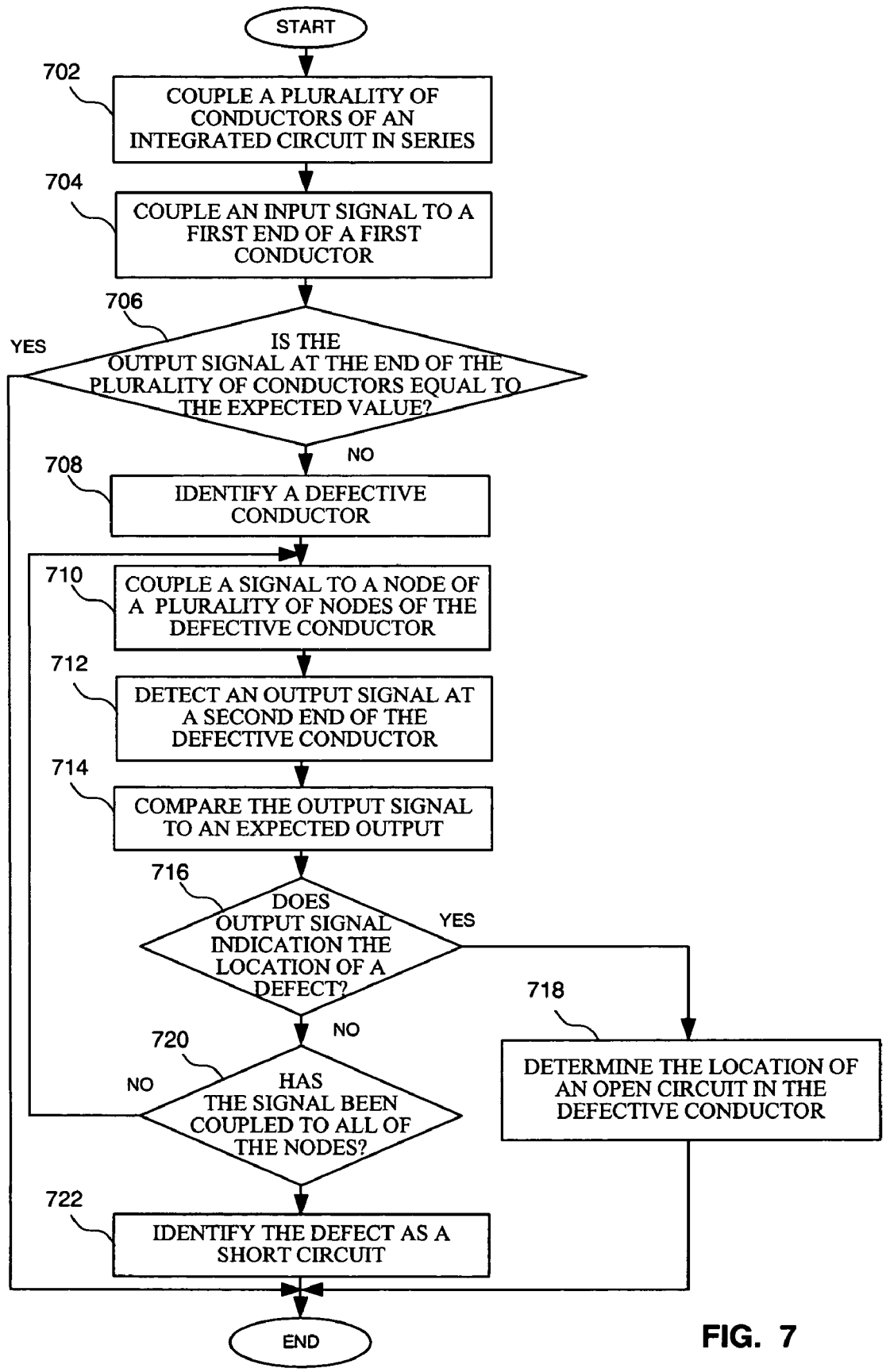
FIG. 7 is a flow chart of a method of detecting a defect in a plurality of conductors according to an embodiment of the present invention.

Turning now to FIG. 7, a flow chart shows a method of detecting a defect in a plurality of conductors according to an embodiment of the present invention. After identifying a failing device, a plurality of conductors of an integrated circuit is coupled in series at a step 702. An input signal is coupled to a first end of a first conductor at a step 704. It is then determined whether the output signal at the end of the plurality of conductors coupled in series is equal to an expected value at a step 706. If so, the layer being tested does not include a defect. If not, it is necessary to identify the defective conductor(s) at a step 708. The defective conductors could be identified as described in reference to FIG. 3, for example.

Once a defective conductor is identified, an input signal is coupled to a node of the defective conductor at a step 710. An output signal is detected at a second end of the defective conductor at a step 712. The output signal is compared to an expected output at a step 714. It is then determined whether the output signal indicates that the location of a defect has been detected at a step 716. If so, the defect is determined to be an open circuit and the location of the defect is determined at a step 718 based upon the node receiving the signal at step 710. If not, it is then determined whether the signal has been coupled to all of the nodes at a step 720. If not, the signal is coupled to the next node at the step 710. If the signal has been coupled to all of the nodes, the defect is identified as a short circuit at a step 722. Any additional conductors could also be analyzed according to the steps 710–722. However, as described above, multiple conductors identified as having defects could be tested simultaneously to determine the type of defect and location of an open circuit.

Figure 8:
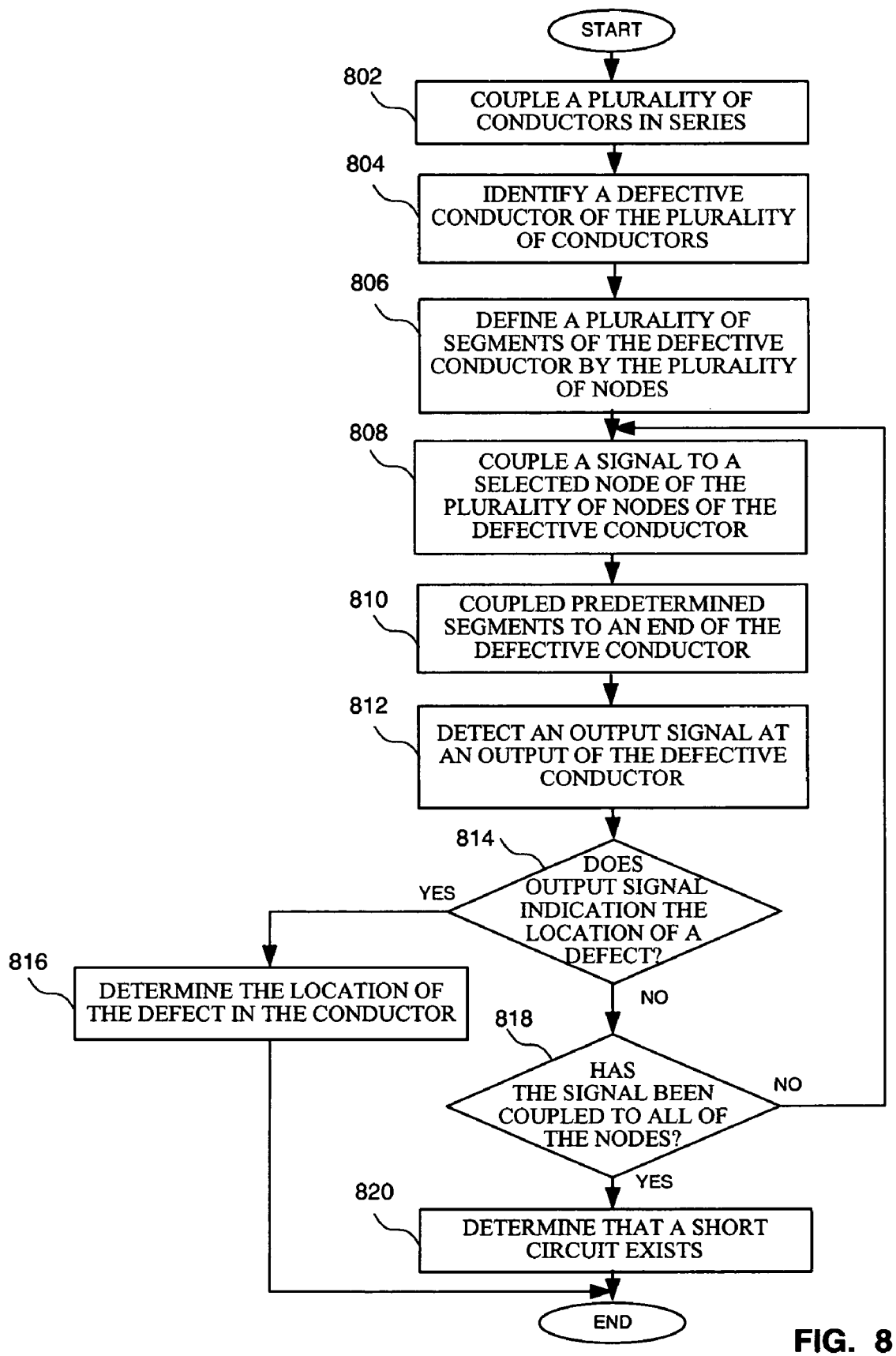
FIG. 8 is a flow chart of a method of detecting the location of a defect in a conductor according to an embodiment the present invention.

Turning now to FIG. 8, a flow chart shows a method of detecting the location of a defect in a conductor according to an embodiment the present invention. A plurality of conductors is coupled in series at a step 802. A defective conductor of the plurality of conductors is identified at a step 804. A plurality of segments of the defective conductor is defined by a plurality of nodes at a step 806. A signal is coupled to a selected node of the plurality of nodes of the defective conductor at a step 808. Predetermined segments are coupled to an end of the conductor based upon the selected node at a step 810. An output signal is detected at an output of the defective conductor at a step 812. It is then determined whether the output signal indicates that the location of a defect has been detected at a step 814. If so, the defect is identified as an open circuit and the location of the defect in the conductor is determined at a step 816. Otherwise it is then determined if the signal has been coupled to all of the nodes at a step 818. If not, the signal is coupled to another node at a step 808. If the signal has been coupled to all of the nodes, it is determined that the defect is a short circuit at a step 820.

It can therefore be appreciated that the new and novel circuit and method of determining the location of a defect in an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for determining the location of a defect in an integrated circuit, said circuit comprising:
   a conductor extending from a first node to a second node;
   an input circuit coupled to said first node of said conductor;
   a driver circuit coupled to said conductor at a node of a plurality of nodes between said first node and said second node; and
   a detector circuit coupled to said second node of said conductor.

2. The circuit of claim 1 further comprising a plurality of conductors adjacent to said first conductor.

3. The circuit of claim 2 wherein said plurality of conductors is coupled in series with said first conductor.

4. The circuit of claim 3 wherein said plurality of conductors is coupled in series by a register coupled between each pair of adjacent conductors.

5. The circuit of claim 1 wherein said input circuit comprises a configurable logic block.

6. The circuit of claim 5 wherein said first node and said second node comprise registers of configurable logic blocks.

7. The circuit of claim 6 further comprising a memory coupled to each said register.

8. The circuit of claim 1 wherein said driver circuit is coupled to a known defective conductor of said plurality of conductors.

9. The circuit of claim 8 wherein said driver circuit comprises a plurality of registers, each register having an output adapted to be coupled to a node of said known defective conductor.

10. The circuit of claim 9 further comprising a plurality of interconnect points adapted to couple said plurality of registers of said driver circuit to said known defective conductor.

11. A circuit for determining the location of a defect in an integrated circuit, said circuit comprising:
    a plurality of parallel conductors;
    means for coupling said plurality of parallel conductors in series;
    means for coupling an input signal to a first end of a first conductor of said plurality of conductors;
    means for driving a node of a defective conductor of said plurality of conductors; and
    means for determining the location of a defect in said defective conductor.

12. The circuit of claim 3 further comprising:
    an input register coupled to a first end of said first conductor; and
    an output register coupled to an end of a last conductor of said plurality of conductors;
    wherein said driver circuit is coupled to a node of a conductor of said plurality of conductors.

13. The circuit of claim 12 further comprising a plurality of registers, each said register coupled between a pair of adjacent conductors.

14. The circuit of claim 13 further comprising a plurality of memories, wherein each said resister is coupled to a memory of said plurality of memories.

15. The circuit of claim 12 wherein said conductors comprise long lines coupling circuits on opposite sides of said integrated circuits.

16. The circuit of claim 15 wherein said driver circuit comprises a plurality of registers, each register having an output adapted to be coupled to a node of said plurality of nodes.

17. The circuit of claim 12 wherein said plurality of conductors comprises a plurality of parallel conductors, the circuit further comprising:

a plurality of routing circuits coupling said plurality of parallel conductors in series, each said routing circuit enabling the selection of an input to said routing circuit;

wherein said driver circuit is coupled to a defective conductor of said plurality of parallel conductors at a node of a plurality of nodes.

18. The circuit of claim 17 wherein each routing circuit of said plurality of routing circuits comprises a multiplexer coupled to receive an output of another routing circuit.

19. The circuit of claim 18 wherein said driver circuit comprises a plurality of registers, each said register having an output adapted to be coupled to a predetermined node of said defective conductor.

20. The circuit of claim 19 wherein said registers comprise configurable logic blocks of a programmable logic device.

* * * * *